(12) United States Patent
Choi et al.

(10) Patent No.: US 10,347,576 B2
(45) Date of Patent: Jul. 9, 2019

(54) PACKAGE SUBSTRATE AND SEMICONDUCTOR PACKAGE INCLUDING THE SAME

(71) Applicant: SAMSUNG ELECTRONICS CO., LTD., Suwon-si, Gyeonggi-do (KR)

(72) Inventors: Kwang-Won Choi, Suwon-si (KR); Sang-Woo Pae, Seongnam-si (KR); Seong-Won Jeong, Suwon-si (KR); Min-Jae Kwon, Seoul (KR); Da-Hye Min, Gwacheon-si (KR); Jin-Chul Park, Hwaseong-si (KR); Jae-Won Chang, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 2 days.

(21) Appl. No.: 15/709,947

(22) Filed: Sep. 20, 2017

(65) Prior Publication Data

US 2018/0090430 A1    Mar. 29, 2018

(30) Foreign Application Priority Data

Sep. 23, 2016   (KR) .................. 10-2016-0122022

(51) Int. Cl.
*H01L 23/498*   (2006.01)
*H01L 23/053*   (2006.01)
(Continued)

(52) U.S. Cl.
CPC ...... *H01L 23/49855* (2013.01); *H01L 23/053* (2013.01); *H01L 23/13* (2013.01); *H01L 23/16* (2013.01); *H01L 23/20* (2013.01); *H01L 23/24* (2013.01); *H01L 23/315* (2013.01); *H01L 23/3121* (2013.01); *H01L 23/3135* (2013.01); *H01L 23/49838* (2013.01); *H01L 24/48* (2013.01); *H01L 21/565* (2013.01); *H01L 2224/48091* (2013.01); *H01L 2224/48106* (2013.01); *H01L 2224/48227* (2013.01)

(58) Field of Classification Search
None
See application file for complete search history.

(56) References Cited

U.S. PATENT DOCUMENTS 6,028,774 A * 2/2000 Shin ................. G06K 19/07745
257/679
8,141,786 B2  3/2012 Bhandarkar et al.
(Continued)

FOREIGN PATENT DOCUMENTS

JP    11-203441 A    7/1999
JP    2003-308505 A   10/2003
(Continued)

*Primary Examiner* — Long Pham
(74) *Attorney, Agent, or Firm* — Lee & Morse, P.C.

(57) ABSTRACT

A semiconductor package includes a package substrate, the package substrate including a conductive plate, an insulating plate on the conductive plate, the insulating plate including a mounting region and a peripheral region surrounding the mounting region, and at least one capillary channel in the peripheral region, a semiconductor chip on the mounting region of the insulating plate, and a molding member on the insulating plate to cover the semiconductor chip, a portion of the molding member being in the at least one capillary channel.

20 Claims, 11 Drawing Sheets

(51) Int. Cl.
  *H01L 23/13* (2006.01)
  *H01L 23/20* (2006.01)
  *H01L 23/24* (2006.01)
  *H01L 23/31* (2006.01)
  *H01L 23/00* (2006.01)
  *H01L 23/16* (2006.01)
  *H01L 21/56* (2006.01)

(56) References Cited

U.S. PATENT DOCUMENTS

2007/0075438 A1* 4/2007 Maeda .................. H01L 21/563
                                                           257/778
2016/0105961 A1    4/2016 Dieu-Gomont et al.

FOREIGN PATENT DOCUMENTS

JP       2012-43341 A     3/2012
KR    10-2005-0045230 A   5/2005

* cited by examiner

PACKAGE SUBSTRATE AND SEMICONDUCTOR PACKAGE INCLUDING THE SAME

CROSS-REFERENCE TO RELATED APPLICATION

Korean Patent Application No. 10-2016-0122022 filed on Sep. 23, 2016, in the Korean Intellectual Property Office, and entitled: "Package Substrate and Semiconductor Package Including the Same," is incorporated by reference herein in its entirety.

BACKGROUND

1. Field

Example embodiments of the present disclosure relate to a package substrate and a semiconductor package including the same. More specifically, example embodiments relate to a package substrate for use in a semiconductor package for a smart card and a semiconductor package for a smart card, including the same.

2. Description of Related Art

A smart card may include a semiconductor package therein. The semiconductor package may include a package substrate, a semiconductor chip, a conductive wire, and a molding member. The semiconductor chip can be mounted on the package substrate. The conductive wire electrically connects the semiconductor chip to the package substrate. The molding member can be formed on the package substrate to cover the semiconductor chip and the conductive wire.

SUMMARY

According to example embodiments, a semiconductor package may include a package substrate having a conductive plate, an insulating plate on the conductive plate, the insulating plate including a mounting region and a peripheral region surrounding the mounting region, and at least one capillary channel in the peripheral region, a semiconductor chip on the mounting region of the insulating plate, and a molding member on the insulating plate to cover the semiconductor chip, a portion of the molding member being in the at least one capillary channel.

According to example embodiments, a package substrate may include a conductive plate, an insulating plate, and a plurality of capillary channels. The insulating plate may include a mounting region for mounting a semiconductor chip and a peripheral region surrounding the mounting region. The plurality of capillary channels may be arranged in the peripheral region and may induce a spread of a molding member covering the semiconductor chip to reduce a thickness of the molding member.

According to example embodiments, a semiconductor package may include a semiconductor chip, a conductive wire connected to the semiconductor chip, a molding member covering the conductive wire and the semiconductor chip, a package substrate, on which the semiconductor chip is mounted, the package substrate being connected to the semiconductor chip by the conductive wire, and the package substrate including at least one capillary channel contacting the molding member, and a frame fixing the package substrate, the frame including a receiving groove accommodating the semiconductor chip, the conductive wire, and the molding member.

According to example embodiments, a semiconductor package may include a package substrate having an insulating plate with a mounting region surrounded by a peripheral region, at least one capillary channel in the peripheral region of the insulating plate, a semiconductor chip on the mounting region of the insulating plate, and a molding member on the insulating plate to cover the semiconductor chip, a portion of the molding member overlapping at least an edge of the at least one capillary channel.

BRIEF DESCRIPTION OF THE DRAWINGS

Features will become apparent to those of ordinary skill in the art by describing in detail exemplary embodiments with reference to the attached drawings, in which.

DETAILED DESCRIPTION OF THE EMBODIMENTS

Various example embodiments will now be described more fully with reference to the accompanying drawings in which some example embodiments are shown. However, embodiments may be embodied in many alternate forms and should not be construed as limited only to example embodiments set forth herein.

Figure 1:
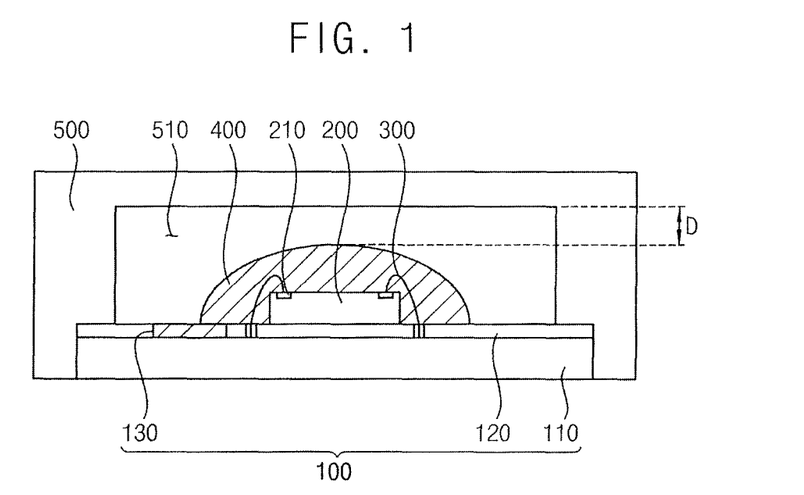
FIG. 1 illustrates a cross-sectional view of a semiconductor package according to an example embodiment.
Figure 2:
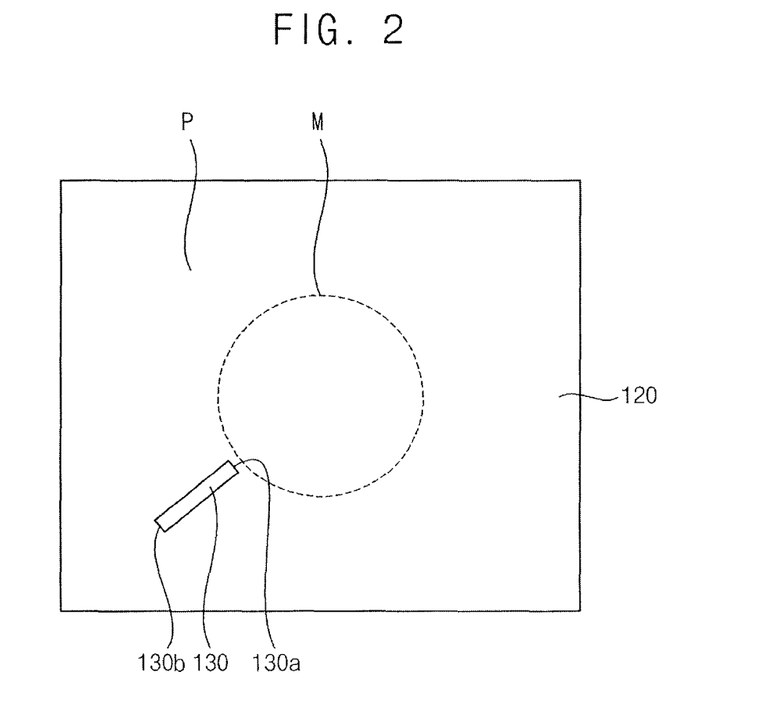
FIG. 2 illustrates a plan view of a package substrate of the semiconductor package of FIG. 1 according to an example embodiment.
Figure 3:
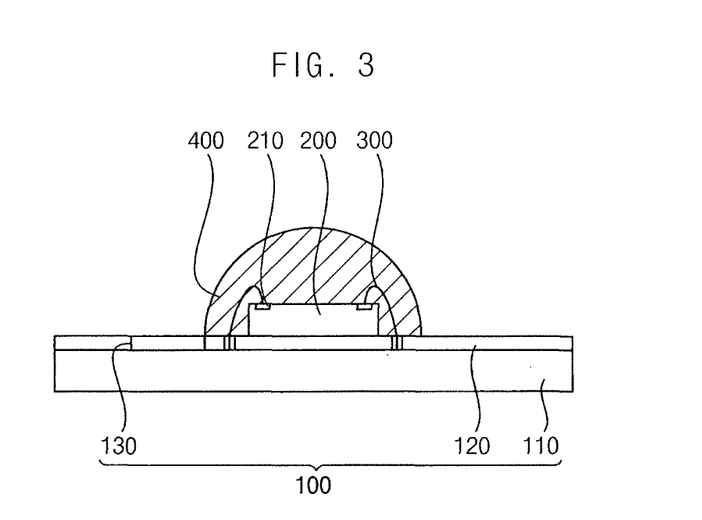
FIGS. 3 and 4 illustrate cross-sectional views of a method of forming a molding member of the semiconductor package of FIG. 1 according to an example embodiment.
Figure 4:
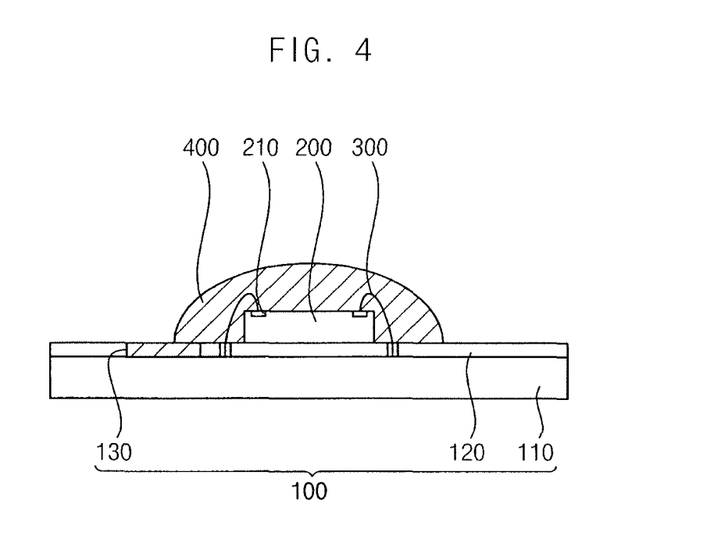

FIG. 1 is a cross-sectional view illustrating a semiconductor package according to an example embodiment. FIG. 2 is a plan view illustrating a package substrate of the semiconductor package of FIG. 1 according to an example embodiment. FIGS. 3 and 4 are cross-sectional views illustrating stages of a method of forming a molding member of the semiconductor package of FIG. 1 according to an example embodiment.

Referring to FIGS. 1 and 2, a semiconductor package according to an example embodiment may include a package substrate 100, a semiconductor chip 200, a conductive wire 300, a molding member 400, and a frame 500. The semiconductor package may be used for a smart card, but is not limited thereto, e.g., the semiconductor package may be used for another electronic device.

The package substrate 100 may include a conductive plate 110, an insulating plate 120, and at least one capillary channel 130. The at least one capillary channel 130 may be within the insulating plate 120.

For example, the conductive plate 110 may have a substantially rectangular shape. Thus, the conductive plate 110 may have four sidewalls. The conductive plate 110 may include a conductive material, e.g., the conductive plate 110 may be a printed circuit board (PCB). The conductive plate 110 may include a metal, e.g., copper or aluminum. However, embodiments are not limited to a rectangular conductive plate.

The insulating plate 120 may be disposed, e.g., directly, on the conductive plate 110. The insulating plate 120 may have the same shape and size, e.g., area in top view, as the conductive plate 110. The insulating plate 120 may include a mounting region M and a peripheral region P. The mounting region M may be a central region of the insulating plate 120. The peripheral region P may be an edge region of the insulating plate 120 surrounding, e.g., an entire perimeter of, the mounting region M. The insulating plate 120 may include at least one opening through which a conductive wire 300 passes, e.g., to contact the conductive plate 110. The semiconductor chip 200 may be mounted on the mounting region M. The insulating plate 120 may include an insulating material, e.g., a polymer. The insulating plate 120 may include a glass fiber.

The capillary channel 130 may be disposed in the peripheral region P of the insulating plate 120. The capillary channel 130 may induce spread of a molding member 400 to reduce a thickness of the molding member 400. For example, a height or distance from a top surface of the insulating plate 120 to a top end of the molding member 400, at which the molding member 400 has the highest probability to be in contact with an inner surface of a receiving groove 510 of the frame 500, may be reduced by the capillary channel 130, as will be described in more detail below.

The semiconductor chip 200, e.g., a Si chip, may be mounded on the mounting region M of the insulating plate 120. The conductive wire 300 may electrically connect the semiconductor chip 200 to the conductive plate 110 through the opening in the insulating plate 120.

Referring to FIG. 3, a liquid molding material, e.g., liquid polymer, may be dropped on the insulating plate 120 to cover the semiconductor chip 200 and the conductive wire 300. For example, referring to FIGS. 2-3, the liquid molding material may be dropped on the mounting region M of the insulating plate 120, and may extend, e.g., radially, beyond the mounting region M to at least partially contact, e.g., overlap, an edge of the capillary channel 130 that faces the mounting region M. For example, the liquid molding material may have a substantially hemispherical shape, e.g., due to surface tension of the liquid molding material.

Referring to FIG. 4, as the liquid molding material contacts an edge of the capillary channel 130, the liquid molding material may spread, e.g., into and, along the capillary channel 130 by capillarity (hatched part in the capillary channel 130 in FIG. 4). Accordingly, a thickness of the liquid molding material in the mounting region M may be reduced. After heating the liquid molding material, the liquid molding material may be cured to form the molding member 400.

In detail, since a portion of the liquid molding material is accommodated in the capillary channel 130, the resultant molding member 400 in FIG. 4 may have a smaller thickness, e.g., height along a direction normal to the conductive plate 110, than a thickness of the liquid molding material shown in FIG. 3. Therefore, a sufficient distance D between a top of the molding member 400 and the inner surface of the receiving groove 510 may be obtained (FIG. 1). Thus, a contact between the molding member 400 and the inner surface of the receiving groove 510 may be prevented. As a result, stress concentration due to contact between the molding member 400 and the inner surface of the receiving groove 510 may be prevented, so damage, e.g., cracking caused by the stress concentration, may be prevented from being generated in the semiconductor chip 200.

For example, as illustrated in FIG. 2, the capillary channel 130 may include a single capillary channel. The capillary channel 130 may be disposed in the peripheral region P of the insulating plate 120 adjacent to, e.g., a bottom left corner of the insulating plate 120, but is not limited thereto. For example, the capillary channel 130 may be disposed in the peripheral region P of the insulating plate 120 adjacent to any one of the other corners of the insulating plate 120 except for the bottom left corner of the insulating plate 120. The capillary channel 130 may have a linear shape extending in a direction from the mounting region M of the insulating plate 120 toward the corner of the insulating plate 120. The capillary channel 130 may have an inner end 130a that faces toward the molding region M of the insulating plate 120 and an outer end 130b that faces toward the corner of the insulating plate 120, opposite to the inner end 130a. The capillary channel 130 may have substantially a same width from the inner end 130a to the outer end 130b.

In some embodiments, the capillary channel 130 may extend in a direction from the mounting region M of the insulating plate 120 to any one of sidewalls of the insulating plate 120. Additionally, the capillary channel 130 may have other various shapes such as a curved shape or a twisting, e.g., winding, shape.

The capillary channel 130 may be formed in the insulating plate 120 using a cutting device. When a volume of the capillary channel 130 is too large, a large amount of the molding member 400 may be accommodated in the capillary channel 130. In this case, the molding member 400 may become too thin, e.g., too much of the material of the molding member 400 may be removed into the capillary channel 130, and thus, the conductive wire 300 may be exposed. Accordingly, the volume of the capillary channel 130 may be determined according to whether the molding member 400 is formed to a sufficient thickness to cover the conductive wire 300.

Referring back to FIGS. 1 and 2, the semiconductor chip 200 may be mounted on the mounting region M of the insulating plate 120. The semiconductor chip 200 may include a bonding pad 210. The bonding pad 210 may include a plurality of bonding pads disposed on opposite side edges of a top surface of the semiconductor chip 200.

The conductive wire 300 may have a top end connected to the bonding pad 210. The conductive wire 300 may have a bottom end connected to the conductive plate 110 through the opening of the insulating plate 120.

The molding member 400 may be formed on the insulating plate 120 to cover the semiconductor chip 200 and the conductive wire 300. As described above, a portion of the molding member 400 may be accommodated in the capillary channel 130.

The frame 500 may include the receiving groove 510. The receiving groove 510 may accommodate at least the molding member 400. The receiving groove 510 may accommodate the package substrate 100, the semiconductor chip 200, the conductive wire 300, and the molding member 400. The package substrate 100 may be fixed to the frame 500.

In detail, the receiving groove 510 may be formed in a lower surface (or formed upward from the lower surface) of the frame 500. For example, the receiving groove 510 may have a substantially rectangular cross-sectional shape. For example, as illustrated in FIG. 1, the receiving groove 510 may be formed to define the frame 500, e.g., the receiving groove 510 may be an empty space surrounded by the frame 500. For example, the frame 500 may be mounted on, e.g., to contact, the package substrate 100, so the molding member 400 with the semiconductor chip 200 may be accommodated in the empty space of the receiving groove 510 while being surrounded by the frame 500, e.g., the frame 500 may surround the top and sides of the molding member 400 while being spaced apart therefrom.

The frame 500 may be a part of a smart card. For example, the receiving groove 510 may be formed in the smart card such that the frame 500 supporting the semiconductor package including the package substrate 100, the semiconductor chip 200, and the molding member 400 may be formed.

Figure 5:
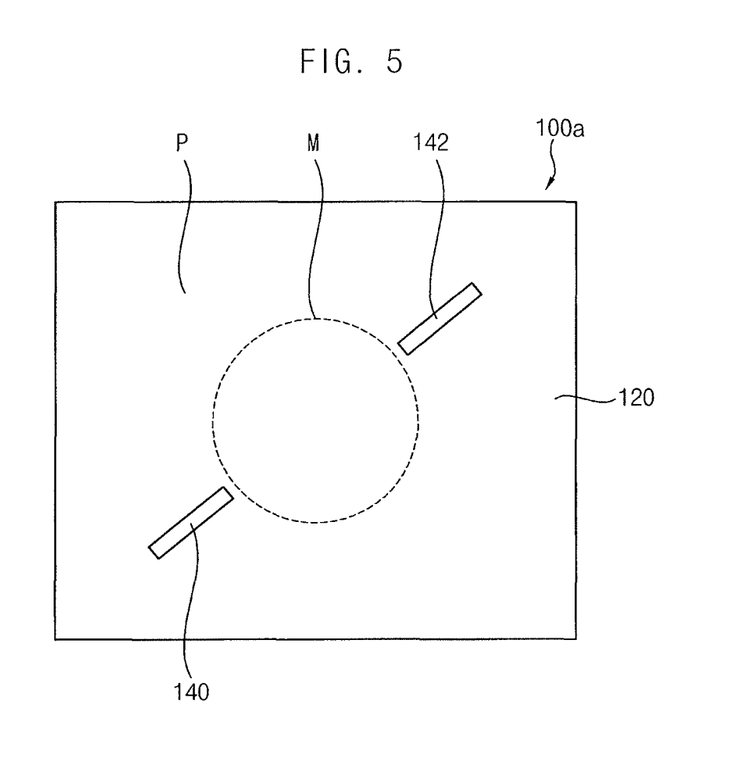
FIGS. 5 to 12 illustrate plan views of package substrates according to example embodiments.

FIG. 5 is a plan view illustrating a package substrate according to an example embodiment.

Referring to FIG. 5, a package substrate 100*a* may include a pair of a first capillary channel 140 and a second capillary channel 142.

For example, the first capillary channel 140 and the second capillary channel 142 may each extend along a diagonal line connecting a bottom left corner of the insulating plate 120 to a top right corner of the insulating plate 120, as viewed in the top view of FIG. 5. As further illustrated in FIG. 5, the first and second capillary channels 140 and 142 may be spaced apart, e.g., completely separated, from each other, e.g., the mounting region M of the insulating plate 120 may be positioned between the first and second capillary channels 140 and 142. The first and second capillary channels 140 and 142 may be arranged at an angular distance of 180°, e.g., the first and second capillary channels 140 and 142 may be collinear.

For example, the first capillary channel 140 may be disposed in the peripheral region P of the insulating plate 120 adjacent to the bottom left corner of the insulating plate 120. For example, the second capillary channel 142 may be disposed in the peripheral region P of the insulating plate 120 adjacent to the top right corner of the insulating plate 120. The first capillary channel 140 may extend toward the bottom left corner of the insulating plate 120. The second capillary channel 142 may extend toward the top right corner of the insulating plate 120. Accordingly, the first and second capillary channels 140 and 142 may be symmetrical with respect to the mounting region M of the insulating plate 120.

In some embodiments, the first capillary channel 140 may be disposed in the peripheral region P adjacent to a top left corner of the insulating plate 120, and the second capillary channel 142 may be disposed in the peripheral region P adjacent to a bottom right corner of the insulating plate 120. In other embodiments, the first and second capillary channels 140 and 142 may be respectively disposed in the peripheral region P of the insulating plate 120 adjacent to opposite sidewalls of the insulating plate 120 and may each extend in a direction oriented away from the molding region M of the insulating plate 120 toward the respective sidewalls of the insulating plate 120. The first and second capillary channels 140 and 142 may have substantially the same shape as the capillary channel 130 shown in FIG. 2.

Since the molding member 400 may spread along the first and second capillary channels 140 and 142 that are disposed symmetrically to each other, a thickness of the molding member 400 may be evenly reduced. For example, a top end of the molding member 400 may be disposed on a vertical line passing through the center of the insulating plate 120.

Figure 6:
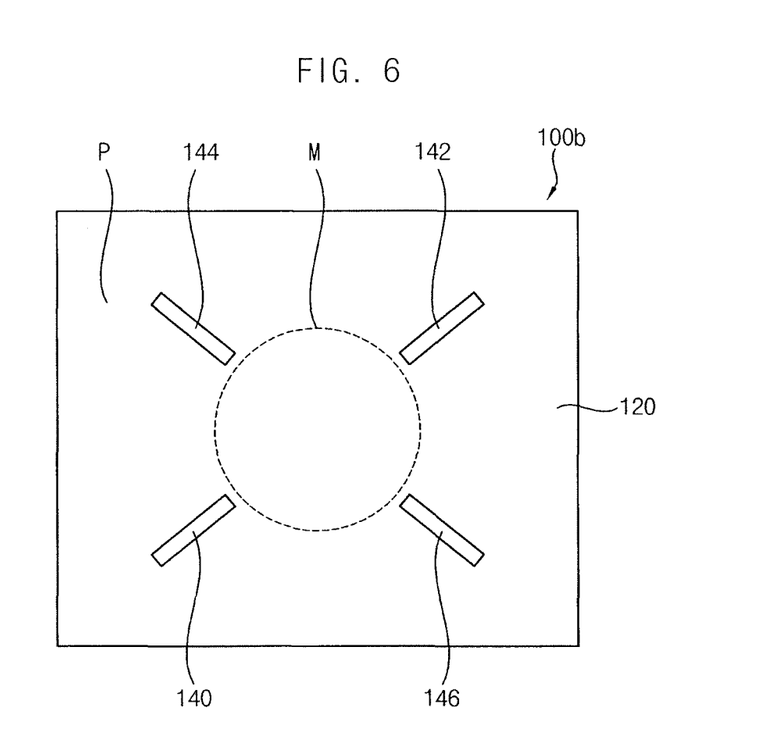

FIG. 6 is a plan view illustrating a package substrate according to an example embodiment.

Referring to FIG. 6, a package substrate 100*b* may include first through fourth capillary channels 140, 142, 144, and 146.

The first and second capillary channels 140 and 142 may each extend along a diagonal line connecting a bottom left corner of an insulating plate 120 to a top right corner of an insulating plate 120 and may be spaced apart from each other, e.g., as discussed previously with reference to FIG. 5. The third and fourth capillary channels 144 and 146 may each extend along a diagonal line connecting a top left corner of an insulating plate 120 to a bottom right corner of an insulating plate 120, e.g., as viewed in the top view of FIG. 6, and may be spaced apart from each other. The first through fourth capillary channels 140, 142, 144 and 146 may be arranged at an angular distance of 90°.

The first capillary channel 140 may be disposed in the peripheral region P of the insulating plate 120 adjacent to the bottom left corner of the insulating plate 120. The second capillary channel 142 may be disposed in the peripheral region P of the insulating plate 120 adjacent to the top right corner of the insulating plate 120. The third capillary channel 144 may be disposed in the peripheral region P of the insulating plate 120 adjacent to the top left corner of the insulating plate 120. The fourth capillary channel 146 may be disposed in the peripheral region P of the insulating plate 120 adjacent to the bottom right corner of the insulating plate 120. The first capillary channel 140 may extend toward the bottom left corner of the insulating plate 120. The second capillary channel 142 may extend toward the top right corner of the insulating plate 120. The third capillary channel 144 may extend toward the top left corner. The fourth capillary channel 146 may extend toward the bottom right corner of the insulating plate 120. Accordingly, the first through fourth capillary channels 140, 142, 144 and 146 may be disposed symmetrically with respect to a mounting region M of the insulating plate 120. The first through fourth capillary channels 140, 142, 144 and 146 may have substantially the same shape as the capillary channel 130 shown in FIG. 2.

Since the molding member 400 may spread along the first through fourth capillary channels 140, 142, 144, and 146 that are disposed symmetrically, a thickness of the molding member 400 may be evenly reduced. For example, a top end of the molding member 400 may be disposed on a vertical line passing through the center of the insulating plate 120 or the center of the semiconductor chip 200 shown in FIG. 1.

Figure 7:
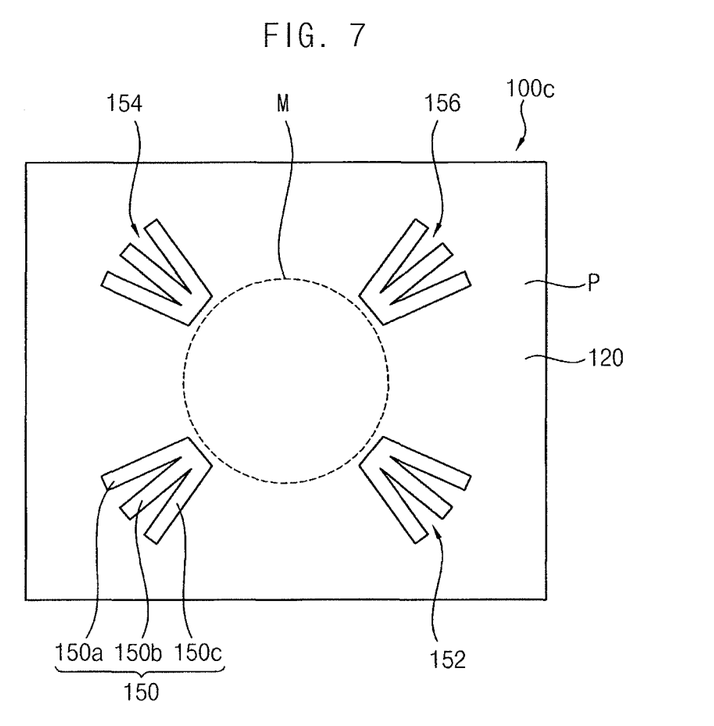

FIG. 7 is a plan view illustrating a package substrate according to an example embodiment.

Referring to FIG. 7, a package substrate 100*c* may include first through fourth capillary channels 150, 152, 154, and 156.

The first capillary channel 150 may be disposed in the peripheral region P of the insulating plate 120 adjacent to the bottom left corner of the insulating plate 120. The second capillary channel 152 may be disposed in the peripheral region P of the insulating plate 120 adjacent to the top right corner of the insulating plate 120. The third capillary channel 154 may be disposed in the peripheral region P of the insulating plate 120 adjacent to the top left corner thereof of the insulating plate 120. The fourth capillary channel 156 may be disposed in the peripheral region P of the insulating plate 120 adjacent to the bottom right corner of the insulating plate 120.

The first through fourth capillary channels 150, 152, 154, and 156 may each include a plurality of branch channels, e.g., three branch channels. In an example embodiment, the first capillary channel 150 may include three branch channels 150*a*, 150*b*, and 150*c*, and the second to fourth capillary channels 152, 154 and 156 may each include the branch channels having the same structure as the branch channels 150*a*, 150*b*, and 150*c* of the first capillary channel 150.

Thus, herein, the branch channels 150a, 150b, and 150c of the first capillary channel 150 are described mainly.

The branch channels 150a, 150b, and 150c may radially extend from one inner end of the first capillary channel 150. For example, the branch channels 150a, 150b, and 150c may diverge from the one inner end of the first capillary channel 150, e.g., from an end of the first capillary channel 150 facing the molding region M, toward the bottom left corner of the insulating plate 120, as seen in FIG. 7. For example, as illustrated in FIG. 7, the branch channels 150a, 150b, and 150c may be connected to each other at the inner end of the first capillary channel 150, and may be separated and spaced apart from each other at an opposite end of the first capillary channel 150. For example, the branch channels 150a, 150b, and 150c may be arranged at substantially the same angular distance.

However, embodiments are not limited to the above. In some embodiments, the branch channels 150a, 150b and 150c may be arranged in parallel. The branch channels 150a, 150b, and 150c may have a substantially uniform width.

Figure 8:
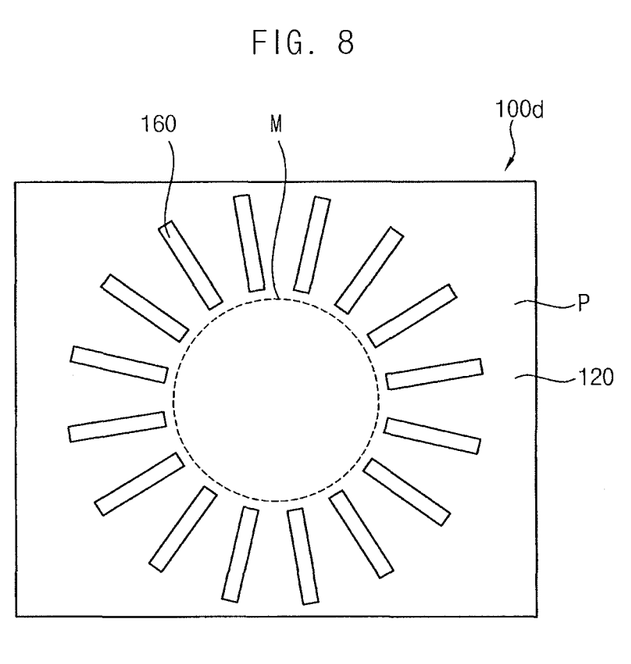

FIG. 8 is a plan view illustrating a package substrate according to an example embodiment.

Referring to FIG. 8, a package substrate 100d may include a plurality of capillary channels 160. The capillary channels 160 may be radially arranged with respect to the mounting region M of the insulating plate 120. For example, the capillary channels 160 may be arranged at a constant angular distance across an entire peripheral region P of the insulating plate 120 according to an embodiment. For example, the capillary channels 160 may be arranged at an angular distance of an acute angle of 30° or less.

Figure 9:
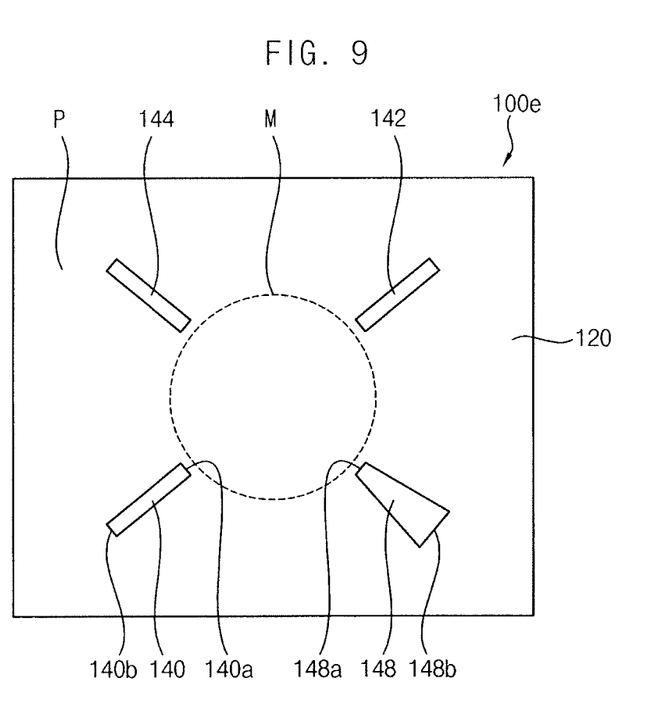

FIG. 9 is a plan view illustrating a package substrate according to an example embodiment.

Referring to FIG. 9, a package substrate 100e may include first through fourth capillary channels 140, 142, 144, and 148. The first through third capillary channels 140, 142, and 144 of the present example embodiment may have the same shape and position as the first through third capillary channels 140, 142, and 144 shown in FIG. 6.

A width of an inner end 148a of the fourth capillary channel 148 may be substantially the same as a width of each of the first through third capillary channels 140, 142, and 144. A width of an outer end 148b of the fourth capillary channel 148 may be different from the width of the inner end 148a of the fourth capillary channel 148. The fourth capillary channel 148 may have a width gradually increasing from the inner end 148a to the outer end 148b. The width of the inner end 148a may be smaller than the width of the outer end 148b. As a result, a volume of the fourth capillary channel 148 may be greater than a volume of each of the first through third capillary channels 140, 142 and 144.

As the volume of the fourth capillary channel 148 is greater than the volume of the first capillary channel 140, an amount of the molding member 400 shown in FIG. 1, to be accommodated in the fourth capillary channel 148 may be greater than the amount of the molding member 400 to be accommodated in the first capillary channel 140.

Such a shape of the fourth capillary channel 148 may adjust fluidity of the liquid molding material shown in FIG. 3. Since the fluidity of the liquid molding material determines a shape of the molding member 400, the shape of the fourth capillary channel 148 may finally adjust the shape of the molding member 400. The shape of the fourth capillary channel 148 may be applied to a shape of the second capillary channel 142 and/or a shape of the third capillary channel 144.

Figure 10:
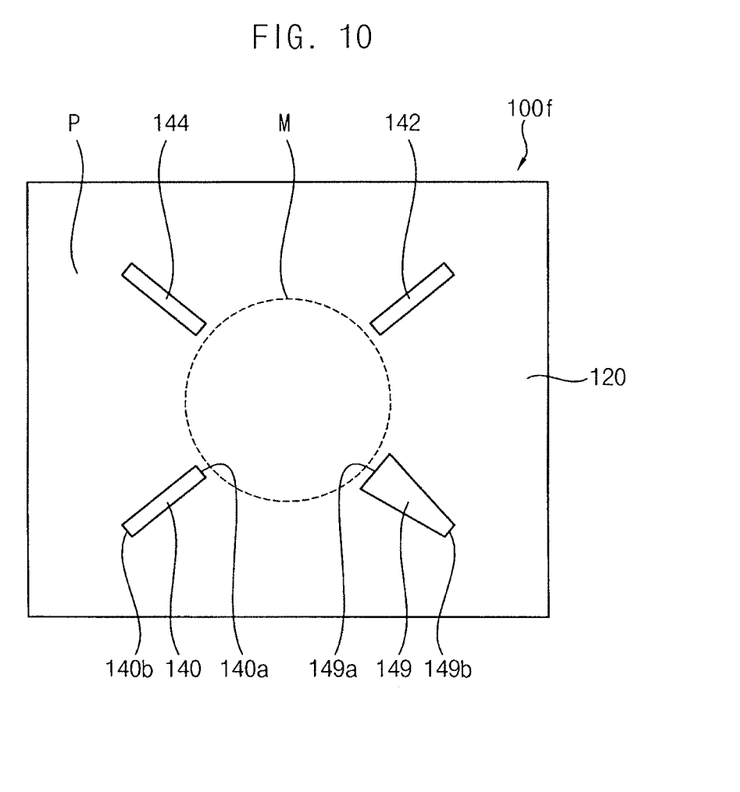

FIG. 10 is a plan view illustrating a package substrate according to an example embodiment.

Referring to FIG. 10, a package substrate 100f may include first through fourth capillary channels 140, 142, 144, and 149. The first through third capillary channels 140, 142, and 144 of the present example embodiment may have the same shape and position as the first through third capillary channels 140, 142, and 144 shown in FIG. 6.

A width of an outer end 149b of the fourth capillary channel 149 may be substantially the same as a width of each of the first through third capillary channels 140, 142 and 144. A width of an inner end 149a of the fourth capillary channel 149 may be different from the width of the outer end 149b of the fourth capillary channel 149. The fourth capillary channel 149 may have a width gradually decreasing from the inner end 149a to the outer end 149b. The width of the inner end 149a may be greater than the width of the outer end 149b. As a result, a volume of the fourth capillary channel 149 may be greater than a volume of each of the first through third capillary channels 140, 142, and 144.

As the volume of the fourth capillary channel 149 is greater than the volume of the first capillary channel 140, an amount of the molding member 400 shown in FIG. 1, to be accommodated in the fourth capillary channel 149 may be greater than the amount of the molding member 400 to be accommodated in the first capillary channel 140.

The fourth capillary channel 149 of the present example embodiment may have a similar function as the fourth capillary channel 148 shown in FIG. 9, and thus duplicate descriptions will be omitted. The shape of the fourth capillary channel 149 may be applied to a shape of the second capillary channel 142 and/or a shape of the third capillary channel 144.

Figure 11:
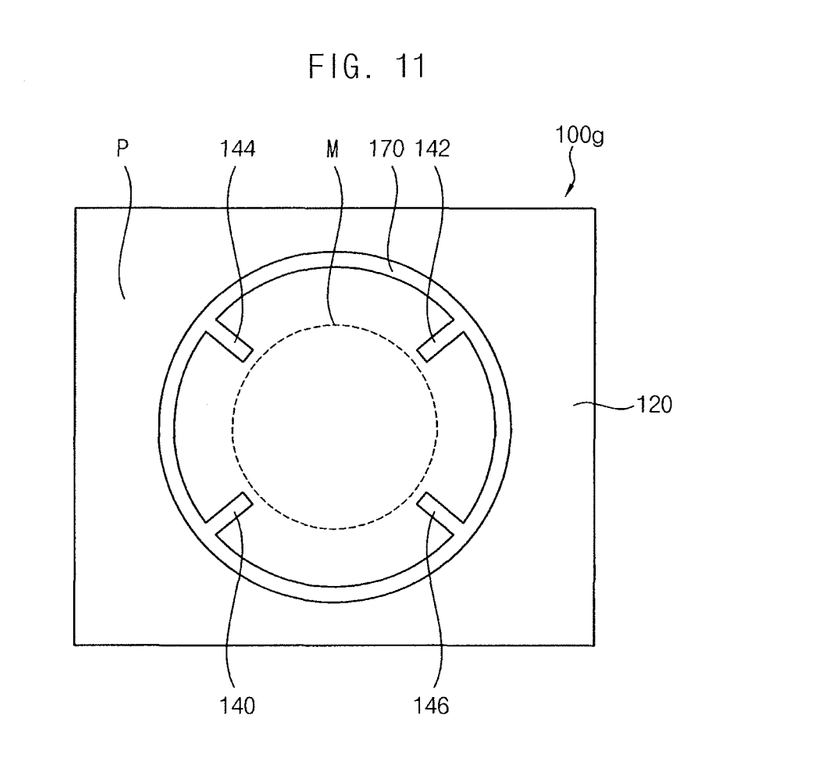

FIG. 11 is a plan view illustrating a package substrate according to an example embodiment. A package substrate 100g of the present example embodiment may include the same components as the package substrate 100b shown in FIG. 6 except for a stopping groove. The same components are denoted by the same reference numerals, and duplicate descriptions thereof will be omitted.

Referring to. FIG. 11, a stopping groove 170 may connect outer ends of first through fourth capillary channels 140, 142, 144, and 146. The first through fourth capillary channels 140, 142, 144, and 146 may be in fluid communication with each other through the stopping groove 170. The stopping groove 170 may have a substantially circumferential shape. In some embodiments, the stopping groove 170 may include a plurality of separated stopping grooves.

When the liquid molding material shown in FIG. 3 excessively flows into the first through fourth capillary channels 140, 142, 144 and 146, the liquid molding material may overflow from the first through fourth capillary channels 140, 142, 144 and 146. The overflowed liquid molding material may become a barrier when the semiconductor package is assembled in the frame 500 shown in FIG. 1. The stopping groove 170 may accommodate the excessively spreading liquid molding material to prevent the liquid molding member from overflowing from the first through fourth capillary channels 140, 142, 144, and 146. The stopping groove 170 may be applied to any one of the package substrate 100 of FIG. 2, the package substrate 100a of FIG. 5, the package substrate 100c of FIG. 7, the package substrate 100d of FIG. 8, the package substrate 100e of FIG. 9, and the package substrate 100f of FIG. 10.

Figure 12:
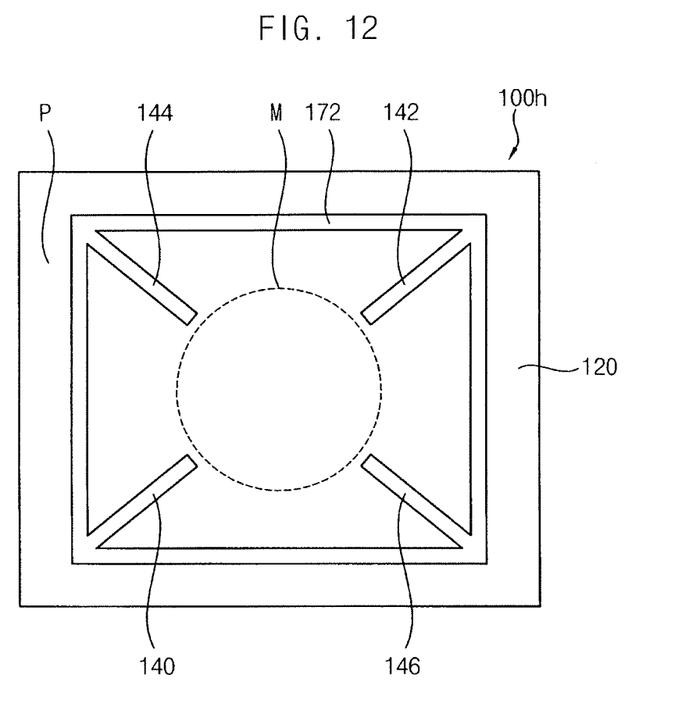

FIG. 12 is a plan view illustrating a package substrate according to an example embodiment. A package substrate 100h of the present example embodiment may include the same components as the package substrate 100f shown in FIG. 11, except for a shape of a stopping groove. The same components are denoted by the same reference numerals, and duplicate descriptions will be omitted.

Referring to FIG. 12, a stopping groove 172 may have a substantially rectangular shape. First through fourth capillary channels 140, 142, 144, and 146 may be connected to each other by the rectangular stopping groove 172. The stopping groove 172 may include a plurality of separated stopping grooves. The stopping groove 172 may be applied to any one of the package substrate 100 of FIG. 2, the package substrate 100a of FIG. 5, the package substrate 100c of FIG. 7, the package substrate 100d of FIG. 8, the package substrate 100e of FIG. 9 and the package substrate 100f of FIG. 10.

Figure 13:
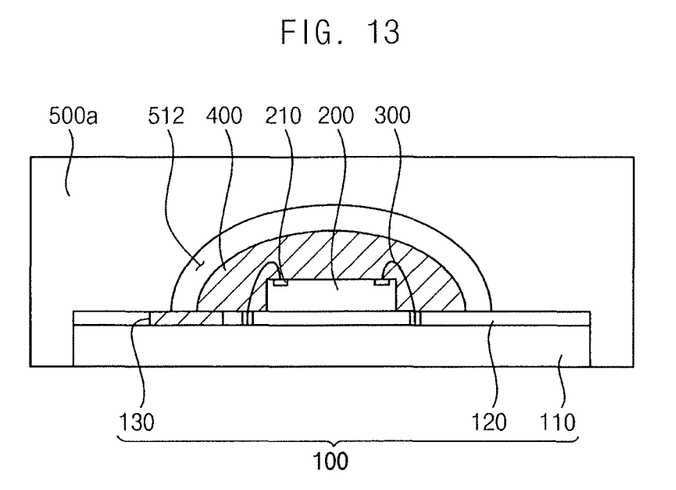
FIGS. 13 and 14 illustrate cross-sectional views of semiconductor packages according to example embodiments.

FIG. 13 is a cross-sectional view illustrating a semiconductor package according to an example embodiment. A semiconductor package of the present example embodiment may include the same components as the semiconductor package shown in FIG. 1 except for a frame. The same components are denoted by the same reference numerals, and duplicate descriptions will be omitted.

Referring to FIG. 13, a receiving groove 512 of a frame 500a may have an inner surface spaced a substantially uniform distance apart from an outer surface of the molding member 400. As the molding member 400 may have a substantially hemispherical shape, the inner surface of the receiving groove 512 may have a substantially hemispherical shape.

Due to the uniform spacing between the inner surface of the receiving groove 512 and the outer surface of the molding member 400, a contact between the inner surface of the receiving groove 512 and the outer surface of the molding member 400 may be suppressed or prevented. Accordingly, damage of the semiconductor chip 200 due to stress concentration may be prevented.

The semiconductor package of the present example embodiment may include, besides the package substrate 100 of FIG. 2, any one of the package substrate 100a of FIG. 5, the package substrate 100b of FIG. 6, the package substrate 100c of FIG. 7, the package substrate 100d of FIG. 8, the package substrate 100e of FIG. 9, the package substrate 100f of FIG. 10, the package substrate 100g of FIG. 11 and the package substrate 100h of FIG. 12.

Figure 14:
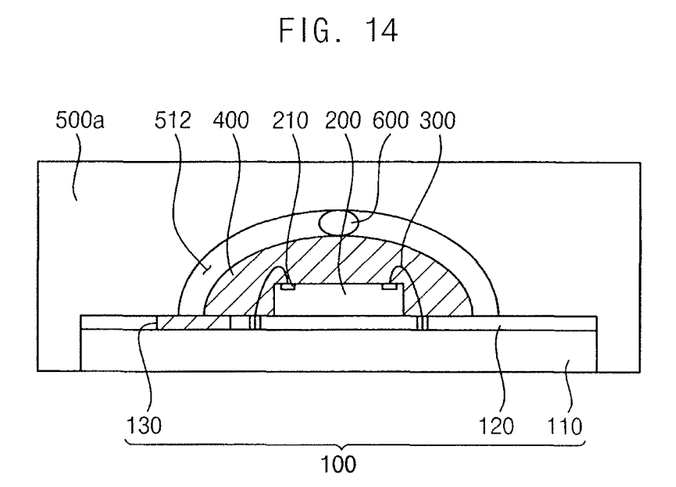

FIG. 14 is a cross-sectional view illustrating a semiconductor package according to example embodiments. A semiconductor package of the present example embodiment may include the same components as the semiconductor package shown in FIG. 13 except for a buffer member. The same components are denoted by the same reference numerals, and duplicate descriptions will be omitted Referring to FIG. 14, a buffer member 600 may be interposed between an inner surface of the receiving groove 512 and an outer surface of the molding member 400. For example, the buffer member 600 may be disposed between a portion of the inner surface of the receiving groove 512 and a top end of the molding member 400, that are positioned on a vertical line passing through the center of an insulating plate 120 or the center of a semiconductor chip 200.

The buffer member 600 may act as a stress relieving member to relieve stress transmitted from the frame 500a to the molding member 400, and thus damage of the semiconductor chip 200 may be prevented. The buffer member 600 may include gel or an air cap.

In some embodiments, the frame 500a may have substantially the same shape as the frame 500 having the shape of the inner surface of the receiving groove 510 shown in FIG. 1. The semiconductor package of the present example embodiment may include, besides the package substrate 100 of FIG. 2, any one of the package substrate 100a of FIG. 5, the package substrate 100b of FIG. 6, the package substrate 100c of FIG. 7, the package substrate 100d of FIG. 8, the package substrate 100e of FIG. 9 and the package substrate 100f of FIG. 10, the package substrate 100g of FIG. 11 and the package substrate 100h of FIG. 12.

By way of summation and review, when a smart card is bent, e.g., when a frame is bent, the molding member may contact a small part of the smart card, e.g., due to hemispherical shape of the molding member protruding toward the smart card. When stress is concentrated at the small contact region between the molding member and the part of the smart card, the semiconductor chip can be damaged due to the stress applied at the contact region.

In contrast, according to example embodiments, as the molding member spreads along the capillary channel of the package substrate, the thickness of the molding member is reduced. Thus, even if the frame is bent, the molding member can be prevented from contacting the frame, e.g., due to the larger space between the frame and molding member. As a result, stress concentration on the semiconductor chip can be suppressed, e.g., contact stress decreases when the bending area of the molding member is wider at bending, and thus damage to the semiconductor chip may be prevented.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
   a package substrate, the package substrate including:
   a conductive plate,
   an insulating plate on the conductive plate, the insulating plate including a mounting region and a peripheral region surrounding the mounting region, and
   at least one capillary channel within the peripheral region, an entire perimeter of the at least one capillary channel being surrounded by the peripheral region of the insulating plate;
   a semiconductor chip on the mounting region of the insulating plate; and
   a molding member on the insulating plate to cover the semiconductor chip, a portion of the molding member being in the at least one capillary channel.

2. The semiconductor package according as claimed in claim 1, wherein the at least one capillary channel extends in a direction oriented from the mounting region of the insulating plate to an edge of the insulating plate.

3. The semiconductor package according as claimed in claim 1, wherein the at least one capillary channel includes at least one pair of capillary channels symmetrical about the mounting region.

4. The semiconductor package according as claimed in claim 3, wherein each capillary channel of the at least one pair of capillary channels includes a plurality of branch channels diverging from an inner end of the capillary channel facing the mounting region.

5. The semiconductor package according as claimed in claim 3, further comprising a stopping groove connecting outer ends of the at least one pair of capillary channels, the stopping groove extending along sidewalls of the insulating plate.

6. The semiconductor package according as claimed in claim 1, wherein the at least one capillary channel includes:
  a first capillary channel having a first inner end facing the mounting region and a first outer end opposite to the first inner end, a width of the first inner end being substantially equal to a width of the first outer end; and
  a second capillary channel having a second inner end facing the mounting region and a second outer end opposite to the second inner end, a width of the second inner end being different from a width of the second outer end.

7. The semiconductor package according as claimed in claim 1, further comprising a frame fixed to the package substrate, the frame including a receiving groove accommodating the molding member, and the molding member being spaced apart from a surface of the receiving groove.

8. A semiconductor package, comprising:
  a semiconductor chip;
  a conductive wire connected to the semiconductor chip;
  a molding member covering the conductive wire and the semiconductor chip;
  a package substrate, on which the semiconductor chip is mounted, the package substrate being connected to the semiconductor chip by the conductive wire, and the package substrate including at least one capillary channel contacting and being filled with the molding member; and
  a frame fixing the package substrate, the frame including a receiving groove accommodating the semiconductor chip, the conductive wire, and the molding member.

9. The package substrate according as claimed in claim 8, wherein the package substrate includes:
  a conductive plate electrically connected to the conductive wire;
  an insulating plate on the conductive plate, the insulating plate including a mounting region, on which the semiconductor chip is mounted, and a peripheral region in which the at least one capillary channel is disposed.

10. The semiconductor package according as claimed in claim 9, wherein the at least one capillary channel includes a plurality of capillary channels arranged in the peripheral region of the insulating plate.

11. The semiconductor package according as claimed in claim 10, wherein the plurality of capillary channels extend toward corners of the insulating plate.

12. The semiconductor package according as claimed in claim 8, wherein an inner surface of the receiving groove is spaced a substantially uniform distance apart from an outer surface of the molding member.

13. The semiconductor package according as claimed in claim 8, further comprising a buffer member between an inner surface of the receiving groove and an outer surface of the molding member.

14. The semiconductor package according as claimed in claim 13, wherein the buffer member includes a gel or an air cap.

15. The semiconductor package according as claimed in claim 8, wherein the frame is a part of a smart card.

16. A semiconductor package, comprising:
  a package substrate, the package substrate including an insulating plate having a mounting region surrounded by a peripheral region, and the mounting region and the peripheral region being continuous and in direct contact with each other;
  at least one capillary channel within the peripheral region of the insulating plate;
  a semiconductor chip on the mounting region of the insulating plate; and
  a molding member on the insulating plate to cover the semiconductor chip, a portion of the molding member overlapping at least an edge of the at least one capillary channel.

17. The semiconductor package according as claimed in claim 16, further comprising a frame fixed to the package substrate, the frame including a receiving groove accommodating the molding member, and the molding member being spaced apart from a surface of the receiving groove.

18. The semiconductor package according as claimed in claim 16, wherein the at least one capillary channel extends in a radial direction oriented from the mounting region toward an edge of the insulating plate.

19. The semiconductor package according as claimed in claim 16, wherein the at least one capillary channel includes first and second capillary channels on opposite ends of the mounting region, the first and second capillary channels being symmetrical with respect to the mounting region.

20. The semiconductor package according as claimed in claim 16, wherein a portion of the molding member is filling an entirety of the at least one capillary channel.

* * * * *